(12) United States Patent
Penley et al.

(10) Patent No.: US 10,679,880 B2
(45) Date of Patent: Jun. 9, 2020

(54) METHOD OF ACHIEVING IMPROVED TRANSIENT RESPONSE IN APPARATUS FOR CONTROLLING FLOW AND SYSTEM FOR ACCOMPLISHING SAME

(71) Applicant: Reno Technologies, Inc., Wilmington, DE (US)

(72) Inventors: Sean Penley, Sparks, NV (US); Michael Maeder, Reno, NV (US); Daniel T. Mudd, Reno, NV (US); Patti J. Mudd, Reno, NV (US)

(73) Assignee: ICHOR SYSTEMS, INC., Fremont, CA (US)

( * ) Notice: Subject to any disclaimer, the term of this patent is extended or adjusted under 35 U.S.C. 154(b) by 138 days.

(21) Appl. No.: 15/717,562

(22) Filed: Sep. 27, 2017

(65) Prior Publication Data

US 2018/0090353 A1    Mar. 29, 2018

Related U.S. Application Data

(60) Provisional application No. 62/400,324, filed on Sep. 27, 2016.

(51) Int. Cl.
| | | |
|---|---|---|
| *F16K 31/02* | (2006.01) | |
| *H01L 21/67* | (2006.01) | |
| *B05B 12/08* | (2006.01) | |
| *B05B 1/30* | (2006.01) | |
| *F16K 1/00* | (2006.01) | |
| *G05D 7/06* | (2006.01) | |
| *F16K 27/02* | (2006.01) | |
| *F16K 37/00* | (2006.01) | |

(52) U.S. Cl.
CPC ...... *H01L 21/67253* (2013.01); *B05B 1/3013* (2013.01); *B05B 12/087* (2013.01); *F16K 1/00* (2013.01); *F16K 27/029* (2013.01); *F16K 37/005* (2013.01); *G05D 7/0647* (2013.01); *H01L 21/67017* (2013.01)

(58) Field of Classification Search
CPC ....... B05B 1/3013; B05B 12/087; F16K 1/00; F16K 27/029; F16K 37/005; G05D 7/0647; H01L 21/67253; H01L 21/67017
USPC .......... 137/487.5; 422/110, 107, 111
See application file for complete search history.

(56) References Cited

U.S. PATENT DOCUMENTS

| | | | |
|---|---|---|---|
| 2,666,297 | A | 1/1954 | Skousgaard |
| 3,271,994 | A | 9/1966 | Fournier et al. |
| 3,335,748 | A | 8/1967 | Klemm et al. |

(Continued)

FOREIGN PATENT DOCUMENTS

| | | |
|---|---|---|
| CN | 1816733 | 8/2006 |
| CN | 102354228 | 2/2012 |

(Continued)

*Primary Examiner* — Minh Q Le
(74) *Attorney, Agent, or Firm* — The Belles Group, P.C.

(57) ABSTRACT

Apparatuses for controlling gas flow are important components for delivering process gases for semiconductor fabrication. In one embodiment, a method of achieving improved transient response in apparatuses for controlling gas flow is disclosed. Specifically, by providing a command to the apparatus to deliver a predetermined mass flow rate at a future turn on time, the apparatus is able to pre-pressurize a P1 volume so that the response time of the apparatus is no longer dependent on the speed of the apparatus's control valves and the limitations of the control loop.

15 Claims, 10 Drawing Sheets

(56) References Cited

U.S. PATENT DOCUMENTS

| | | | |
|---|---|---|---|
| 3,453,861 A | 7/1969 | Levasseur | |
| 3,491,946 A | 1/1970 | Muller | |
| 3,504,692 A | 4/1970 | Goldstein | |
| 3,559,482 A | 2/1971 | Baker et al. | |
| 3,570,807 A | 3/1971 | Sturman et al. | |
| 3,807,456 A | 4/1974 | Colletti | |
| 3,814,341 A | 6/1974 | Dent et al. | |
| 1,841,520 A | 10/1974 | Bryant et al. | |
| 3,910,113 A | 10/1975 | Brown | |
| 4,015,626 A | 4/1977 | Thordarson | |
| 4,096,746 A | 6/1978 | Wilson et al. | |
| 4,118,009 A | 10/1978 | Chmura | |
| 4,203,465 A | 5/1980 | Rissi | |
| 4,253,156 A | 2/1981 | Lisle et al. | |
| 4,275,752 A | 6/1981 | Collier et al. | |
| 4,304,263 A | 12/1981 | Choate | |
| 4,315,323 A | 2/1982 | Mahawili et al. | |
| 4,327,757 A | 5/1982 | Weevers | |
| 4,406,161 A | 9/1983 | Locke et al. | |
| 4,462,915 A | 7/1984 | Friedman | |
| 4,576,043 A | 3/1986 | Nguyen | |
| 4,589,440 A | 5/1986 | Panet | |
| 4,718,443 A | 1/1988 | Adney et al. | |
| 4,741,359 A | 5/1988 | Siebald | |
| 4,796,651 A | 1/1989 | Ginn et al. | |
| 4,858,643 A | 8/1989 | Vavra et al. | |
| 4,888,117 A | 12/1989 | Brown et al. | |
| 4,904,285 A | 2/1990 | Yamada et al. | |
| 4,918,995 A | 4/1990 | Pearman et al. | |
| 5,003,810 A | 4/1991 | Jepson et al. | |
| 5,044,199 A | 9/1991 | Drexel et al. | |
| 5,052,363 A | 10/1991 | Stiles | |
| 5,062,446 A | 11/1991 | Anderson | |
| 5,080,131 A | 1/1992 | Ono et al. | |
| 5,100,100 A | 3/1992 | Benson et al. | |
| 5,100,551 A | 3/1992 | Pall et al. | |
| 5,114,447 A | 5/1992 | Davis et al. | |
| 5,123,439 A | 6/1992 | Powers | |
| 5,129,418 A | 7/1992 | Shimomura et al. | |
| 5,152,483 A | 10/1992 | Maeng | |
| 5,159,951 A | 11/1992 | Ono et al. | |
| 5,161,576 A | 11/1992 | Hekkert et al. | |
| 5,187,771 A | 2/1993 | Uchida | |
| 5,187,972 A | 2/1993 | Defriez | |
| 5,190,068 A | 3/1993 | Philbin | |
| 5,259,243 A | 11/1993 | Drexel et al. | |
| 5,280,773 A | 1/1994 | Becker | |
| 5,285,673 A | 2/1994 | Drexel et al. | |
| 5,297,427 A | 3/1994 | Shambayati | |
| 5,305,638 A | 4/1994 | Saghatchi et al. | |
| 5,311,762 A | 5/1994 | Drexel | |
| 5,321,992 A | 6/1994 | Mudd et al. | |
| 5,325,705 A | 7/1994 | Tom | |
| 5,329,966 A | 7/1994 | Fenimore et al. | |
| 5,359,878 A | 11/1994 | Mudd | |
| 5,419,133 A | 5/1995 | Schneider | |
| 5,439,026 A | 8/1995 | Moriya et al. | |
| 5,445,035 A | 8/1995 | Delajoud | |
| 5,511,585 A | 4/1996 | Lee | |
| 5,542,284 A | 8/1996 | Layzell et al. | |
| 5,549,272 A | 8/1996 | Kautz | |
| 5,583,282 A | 12/1996 | Tom | |
| 5,624,409 A | 4/1997 | Seale | |
| 5,640,299 A | 8/1997 | Mudd | |
| 5,669,408 A | 9/1997 | Nishino et al. | |
| 5,711,786 A | 1/1998 | Hinshaw | |
| 5,730,181 A | 3/1998 | Doyle et al. | |
| 5,762,086 A * | 6/1998 | Ollivier | F16K 31/1225 137/1 |
| 5,804,717 A | 9/1998 | Lucas | |
| 5,816,285 A | 10/1998 | Ohmi et al. | |
| 5,865,205 A | 2/1999 | Wilmer | |
| 5,868,159 A | 2/1999 | Loan et al. | |
| 5,904,170 A | 5/1999 | Harvey et al. | |
| 5,911,238 A | 6/1999 | Bump et al. | |
| 5,917,066 A | 6/1999 | Eisenmann et al. | |
| 5,918,616 A | 7/1999 | Sanfilippo et al. | |
| 5,935,418 A | 8/1999 | Chakrabazty et al. | |
| 5,944,048 A | 8/1999 | Bump et al. | |
| 5,970,801 A | 10/1999 | Ciobanu et al. | |
| 5,975,126 A | 11/1999 | Bump et al. | |
| 5,988,211 A | 11/1999 | Cornell | |
| 6,015,590 A | 1/2000 | Suntola | |
| 6,026,834 A | 2/2000 | Azima | |
| 6,026,847 A | 2/2000 | Reinicke et al. | |
| 6,062,246 A | 5/2000 | Tanaka et al. | |
| 6,062,256 A | 5/2000 | Miller et al. | |
| 6,074,691 A | 6/2000 | Schmitt et al. | |
| 6,080,219 A | 6/2000 | Jha et al. | |
| 6,116,269 A | 9/2000 | Maxson | |
| 6,119,710 A | 9/2000 | Brown | |
| 6,125,869 A | 10/2000 | Horiuchi | |
| 6,138,708 A | 10/2000 | Waldbusser | |
| 6,152,162 A | 11/2000 | Balazy et al. | |
| 6,178,995 B1 | 1/2001 | Ohmi et al. | |
| 6,269,692 B1 | 8/2001 | Drexel et al. | |
| 6,303,501 B1 | 10/2001 | Chen et al. | |
| 6,314,991 B1 | 11/2001 | Gill | |
| 6,352,001 B1 | 3/2002 | Wickert et al. | |
| 6,422,256 B1 | 7/2002 | Balazy et al. | |
| 6,422,264 B2 | 7/2002 | Ohmi et al. | |
| 6,425,281 B1 | 7/2002 | Sheriff et al. | |
| 6,443,174 B2 | 9/2002 | Mudd | |
| 6,539,968 B1 | 4/2003 | White et al. | |
| 6,561,218 B2 | 5/2003 | Mudd | |
| 6,564,825 B2 | 5/2003 | Lowery et al. | |
| 6,631,334 B2 | 10/2003 | Grosshart | |
| 6,655,408 B2 | 12/2003 | Linthorst | |
| 6,712,084 B2 | 3/2004 | Shajii et al. | |
| 6,752,166 B2 | 6/2004 | Lull et al. | |
| 6,799,603 B1 | 10/2004 | Moore | |
| 6,832,628 B2 * | 12/2004 | Thordarson | G05D 7/0106 137/488 |
| 6,868,862 B2 | 3/2005 | Shajii et al. | |
| 6,881,263 B2 | 4/2005 | Lindfors et al. | |
| 6,948,508 B2 | 9/2005 | Shajii et al. | |
| 7,037,372 B2 | 5/2006 | Lindfors et al. | |
| 7,073,392 B2 | 7/2006 | Lull et al. | |
| 7,136,767 B2 | 11/2006 | Shajii et al. | |
| 7,216,019 B2 | 5/2007 | Tinsley et al. | |
| 7,252,032 B2 | 8/2007 | Scheffel et al. | |
| 7,334,602 B2 | 2/2008 | Ahn | |
| 7,317,805 B2 | 3/2008 | Brown et al. | |
| 7,353,841 B2 | 4/2008 | Kono et al. | |
| 7,370,664 B2 | 5/2008 | Glite | |
| 7,424,346 B2 | 9/2008 | Shajii et al. | |
| 7,411,045 B2 | 10/2008 | Mudd et al. | |
| 7,474,968 B2 | 1/2009 | Ding et al. | |
| 7,552,015 B2 | 6/2009 | Shajii et al. | |
| 7,615,120 B2 * | 11/2009 | Shajii | C23C 16/45527 118/663 |
| 7,628,861 B2 | 12/2009 | Clark | |
| 7,662,233 B2 | 2/2010 | Sneh | |
| 7,680,399 B2 | 3/2010 | Buchanan et al. | |
| 7,682,946 B2 | 3/2010 | Ma et al. | |
| 7,693,606 B2 | 4/2010 | Ahmad et al. | |
| 7,706,925 B2 | 4/2010 | Ding et al. | |
| 7,717,061 B2 | 5/2010 | Ishizaka et al. | |
| 7,757,554 B2 * | 7/2010 | Ding | G01F 22/02 73/239 |
| 7,809,473 B2 | 10/2010 | Shajii et al. | |
| 7,826,986 B2 | 11/2010 | McDonald | |
| 7,850,779 B2 | 12/2010 | Ma et al. | |
| 7,874,208 B2 | 1/2011 | Redemann et al. | |
| 7,881,829 B2 | 2/2011 | Yoneda et al. | |
| 7,891,228 B2 | 2/2011 | Ding et al. | |
| 7,905,139 B2 | 3/2011 | Lull | |
| 7,918,238 B2 | 4/2011 | Tanaka et al. | |
| 7,922,150 B2 | 4/2011 | Cripps et al. | |
| 7,974,544 B2 | 7/2011 | Kobayashi | |
| 7,979,165 B2 | 7/2011 | Gotoh et al. | |
| 8,100,382 B2 | 1/2012 | Robertson, III et al. | |
| 8,104,323 B2 | 1/2012 | Yasuda | |
| 8,112,182 B2 | 2/2012 | Tokuhisa et al. | |

(56) References Cited

U.S. PATENT DOCUMENTS

| | | | |
|---|---|---|---|
| 8,183,781 B2 | 5/2012 | Sangam | |
| 8,201,989 B2 | 6/2012 | Itoh et al. | |
| 8,205,629 B2 | 6/2012 | Gregor et al. | |
| 8,265,795 B2 | 9/2012 | Takahashi et al. | |
| 8,282,992 B2 | 10/2012 | Myo et al. | |
| 8,291,857 B2 | 10/2012 | Lam et al. | |
| 8,293,015 B2 | 10/2012 | Lam et al. | |
| 8,340,827 B2 | 12/2012 | Yun et al. | |
| 8,343,258 B2 | 1/2013 | Guan | |
| 8,343,279 B2 | 1/2013 | Myo et al. | |
| 8,356,623 B2 | 1/2013 | Isobe et al. | |
| 8,376,312 B2 | 2/2013 | Mudd et al. | |
| 8,382,897 B2 | 2/2013 | Sangam | |
| 8,408,245 B2 | 4/2013 | Feldman et al. | |
| 8,443,649 B2 | 5/2013 | Yasuda et al. | |
| 8,460,753 B2 | 6/2013 | Xiao et al. | |
| 8,504,318 B2 | 8/2013 | Mendelson et al. | |
| 8,505,478 B2 | 8/2013 | Suekane et al. | |
| 8,511,337 B2 | 8/2013 | Nishimura | |
| 8,573,247 B2 | 11/2013 | Ushigusa et al. | |
| 8,744,784 B2 | 6/2014 | Yasuda et al. | |
| 8,746,057 B2 | 6/2014 | Yasuda et al. | |
| 8,770,215 B1 | 7/2014 | Mudd et al. | |
| 8,789,556 B2 | 7/2014 | Yasuda et al. | |
| 8,793,082 B2* | 7/2014 | Ding | G01F 5/00 702/47 |
| 8,794,261 B2* | 8/2014 | Watanabe | F17D 3/00 137/486 |
| 8,800,589 B2 | 8/2014 | Minami et al. | |
| 8,851,105 B2 | 10/2014 | Kashima et al. | |
| 8,910,656 B2 | 12/2014 | Yasuda | |
| 8,997,686 B2* | 4/2015 | Ding | C23C 16/448 118/696 |
| 9,027,585 B2 | 5/2015 | Smirnov | |
| 9,058,041 B2* | 6/2015 | Lacouture | F01N 3/208 |
| 9,081,388 B2 | 7/2015 | Tanaka et al. | |
| 9,188,989 B1* | 11/2015 | Mudd | G05D 7/0635 |
| 9,207,139 B2 | 12/2015 | Jones et al. | |
| 9,223,318 B2 | 12/2015 | Takeuchi et al. | |
| 9,507,352 B2* | 11/2016 | Dohi | F16K 7/16 |
| 9,690,301 B2 | 6/2017 | Mudd et al. | |
| 9,958,302 B2* | 5/2018 | Mudd | F16K 37/005 |
| 10,031,531 B2* | 7/2018 | Ding | G05D 11/132 |
| 2001/0013363 A1 | 8/2001 | Kitayama et al. | |
| 2002/0002996 A1 | 1/2002 | Mudd | |
| 2002/0014206 A1 | 2/2002 | Mudd | |
| 2002/0046612 A1 | 4/2002 | Mudd | |
| 2002/0095225 A1 | 7/2002 | Huang et al. | |
| 2004/0007180 A1 | 1/2004 | Yamasaki et al. | |
| 2004/0083807 A1 | 5/2004 | Mudd et al. | |
| 2004/0244837 A1* | 12/2004 | Nawata | G05D 7/0635 137/487.5 |
| 2005/0056211 A1 | 3/2005 | Lindfors et al. | |
| 2005/0087299 A1 | 4/2005 | Okabe et al. | |
| 2005/0098906 A1 | 5/2005 | Satoh et al. | |
| 2006/0005883 A1 | 1/2006 | Mudd et al. | |
| 2006/0037644 A1 | 2/2006 | Nishikawa et al. | |
| 2006/0060139 A1 | 3/2006 | Meneghini et al. | |
| 2006/0124173 A1 | 6/2006 | An | |
| 2006/0130755 A1 | 6/2006 | Clark | |
| 2006/0207503 A1* | 9/2006 | Meneghini | C23C 16/4485 118/715 |
| 2007/0089789 A1 | 4/2007 | Mudd et al. | |
| 2007/0110636 A1 | 5/2007 | Lee et al. | |
| 2007/0227659 A1 | 10/2007 | Iizuka | |
| 2008/0041481 A1 | 2/2008 | Mudd et al. | |
| 2008/0305014 A1 | 12/2008 | Honda | |
| 2009/0101217 A1 | 4/2009 | Ushigusa et al. | |
| 2010/0110399 A1 | 5/2010 | Lyons | |
| 2010/0138051 A1 | 6/2010 | Glime | |
| 2010/0224264 A1 | 9/2010 | Homan et al. | |
| 2010/0269924 A1 | 10/2010 | Yasuda | |
| 2011/0108126 A1* | 5/2011 | Monkowski | G05D 7/0635 137/12 |
| 2012/0116596 A1 | 5/2012 | Yoneda et al. | |
| 2012/0132291 A1 | 5/2012 | Monkowski et al. | |
| 2012/0180876 A1 | 7/2012 | Hayashi et al. | |
| 2012/0318383 A1 | 12/2012 | Yasuda et al. | |
| 2013/0092256 A1 | 4/2013 | Yasuda et al. | |
| 2013/0092258 A1 | 4/2013 | Yasuda et al. | |
| 2013/0118596 A1 | 5/2013 | Horsky | |
| 2013/0186499 A1 | 7/2013 | Yada et al. | |
| 2014/0034164 A1 | 2/2014 | Yasuda | |
| 2014/0069527 A1* | 3/2014 | Mudd | G05D 7/0635 137/487 |
| 2014/0083514 A1* | 3/2014 | Ding | G05D 7/0647 137/12 |
| 2014/0158211 A1 | 6/2014 | Ding et al. | |
| 2014/0190578 A1 | 7/2014 | Hayashi | |
| 2014/0230915 A1* | 8/2014 | Mudd | G05D 7/0647 137/15.08 |
| 2014/0260963 A1 | 9/2014 | Wang | |
| 2015/0007897 A1 | 1/2015 | Valentine et al. | |
| 2015/0027558 A1 | 1/2015 | Kehoe et al. | |
| 2015/0121988 A1 | 5/2015 | Banares et al. | |
| 2015/0212524 A1 | 7/2015 | Kehoe et al. | |
| 2015/0362391 A1 | 12/2015 | Suzuki et al. | |
| 2016/0011604 A1 | 1/2016 | Mudd et al. | |
| 2016/0018828 A1* | 1/2016 | Mudd | G05D 7/0647 700/282 |
| 2016/0041564 A1* | 2/2016 | Mudd | G05D 7/0641 700/275 |
| 2016/0124439 A1 | 5/2016 | Yasuda et al. | |
| 2016/0327963 A1* | 11/2016 | Hirata | G05D 7/0641 |

FOREIGN PATENT DOCUMENTS

| | | |
|---|---|---|
| CN | 103838261 | 6/2014 |
| DE | 69535683 | 1/2009 |
| EP | 0468793 | 1/1992 |
| EP | 0671484 | 9/1995 |
| EP | 0689040 | 12/1995 |
| JP | 11119835 | 4/1999 |
| JP | 2000018407 | 1/2000 |
| JP | 2004157719 | 6/2004 |
| JP | 3557087 | 8/2004 |
| JP | 2004302914 | 10/2004 |
| JP | 2007041870 | 2/2007 |
| JP | 4137666 | 8/2008 |
| JP | 4146746 | 9/2008 |
| JP | 2009079667 | 4/2009 |
| JP | 4351495 | 10/2009 |
| JP | 2009300403 | 12/2009 |
| JP | 4572139 | 10/2010 |
| JP | 4589846 | 12/2010 |
| JP | 4705140 | 6/2011 |
| JP | 2011171337 | 9/2011 |
| JP | 4974000 | 7/2012 |
| JP | 5090559 | 12/2012 |
| JP | 5091821 | 12/2012 |
| TW | 201414990 | 4/2014 |
| WO | WO8700267 | 1/1987 |
| WO | WO03081361 | 10/2003 |
| WO | WO200401516 | 12/2003 |
| WO | WO2011040409 | 4/2011 |

* cited by examiner

METHOD OF ACHIEVING IMPROVED TRANSIENT RESPONSE IN APPARATUS FOR CONTROLLING FLOW AND SYSTEM FOR ACCOMPLISHING SAME

CROSS REFERENCE TO RELATED APPLICATIONS

The present application claims the benefit of U.S. Provisional Patent Application No. 62/400,324, filed Sep. 27, 2016, the entirety of which is incorporated herein by reference.

BACKGROUND OF THE INVENTION

Mass flow control has been one of the key technologies in semiconductor chip fabrication. Apparatuses for controlling mass flow are important for delivering known flow rates of process gases for semiconductor fabrication and other industrial processes. Such devices are used to measure and accurately control the flow of fluids for a variety of applications.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases.

SUMMARY OF THE INVENTION

The present technology is directed to a method of improving the transient turn on performance of a pressure based apparatus for controlling flow. This is achieved by pre-pressurizing a volume within the apparatus prior to opening a valve, the valve allowing gas to flow out an outlet of the apparatus.

In one embodiment, the invention is a method of delivering a gas at a predetermined flow rate. A gas flow control apparatus is provided, the gas flow control apparatus having a gas flow path extending from a gas inlet to a gas outlet, a proportional valve coupled to the flow path, an on/off valve coupled to the flow path and downstream of the proportional valve, a volume of the gas flow path defined between the proportional valve and the on/off valve. A flow restrictor having a flow impedance is located downstream of the proportional valve. The volume of the apparatus is pressurized with the gas to a target pre-flow pressure by opening the proportional valve while the on/off valve is off, the target pre-flow pressure being selected to achieve the predetermined flow rate. Finally, the on/off valve is opened to deliver the gas to the gas outlet at the predetermined flow rate.

In another embodiment, the invention is a system for delivering a gas at a predetermined flow rate. The system has a gas flow control apparatus having a gas flow path extending from a gas inlet to a gas outlet, a proportional valve coupled to the flow path, an on/off valve coupled to the flow path and downstream of the proportional valve, a volume of the gas flow path defined between the proportional valve and the on/off valve. A flow restrictor having a flow impedance is located downstream of the proportional valve. A controller pressurizes the volume with the gas to a target pre-flow pressure by opening the proportional valve while the on/off valve is off, the target pre-flow pressure being selected to achieve the predetermined flow rate. Finally, the controller opens the on/off valve to deliver the gas to the gas outlet at the predetermined flow rate.

In yet another embodiment, the invention is a method of delivering gas at a predetermined flow rate. A controller generates a gas flow activation signal at a first time, the signal comprising data identifying a second time at which the gas is to be delivered from a gas outlet of a gas flow path at the predetermined flow rate. The first time is prior to the second time and a priming period is defined as the time between the first and second times. Upon receipt of the gas flow activation signal, the controller adjusts one or more components of a gas flow apparatus to achieve a primed condition of the gas in a volume of the gas flow path during the priming period, the priming period selected to achieve the predetermined flow rate. During the priming period, the gas is prohibited from exiting the gas outlet of the gas flow path. Finally, gas is delivered from the volume at the second time via the gas outlet of the gas flow path.

In another embodiment, the invention is a system for delivering a gas at a predetermined flow rate, the system having a gas flow path extending from a gas inlet to a gas outlet, one or more components configured to define a volume of the gas flow path and control flow of the gas through the gas flow path, and a controller. The controller is configured to generate a gas flow activation signal at a first time, the signal identifying a second time at which the gas is to be delivered from the gas outlet, the first time being prior to the second time and a priming period being defined between the first and second times. The controller is also configured to adjust the one or more components to achieve a primed condition of the gas in the volume during the priming period upon receipt of the gas flow activation signal, the primed condition selected to achieve the predetermined flow rate. The gas is prohibited from exiting the gas outlet of the gas flow path during the priming period. Finally, the controller is configured to adjust the one or more components to deliver the gas from the volume at the second time.

In a further embodiment, the invention is a method of delivering gas at a predetermined flow rate. The method involves priming, in a volume of a gas flow path and during a priming period, a gas to a primed condition, the primed condition selected to achieve the predetermined flow rate. The gas is prohibited from exiting a gas outlet of the gas flow path during the priming period. Second, gas is delivered from the volume subsequent to the priming period.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

DETAILED DESCRIPTION

Figure 1:
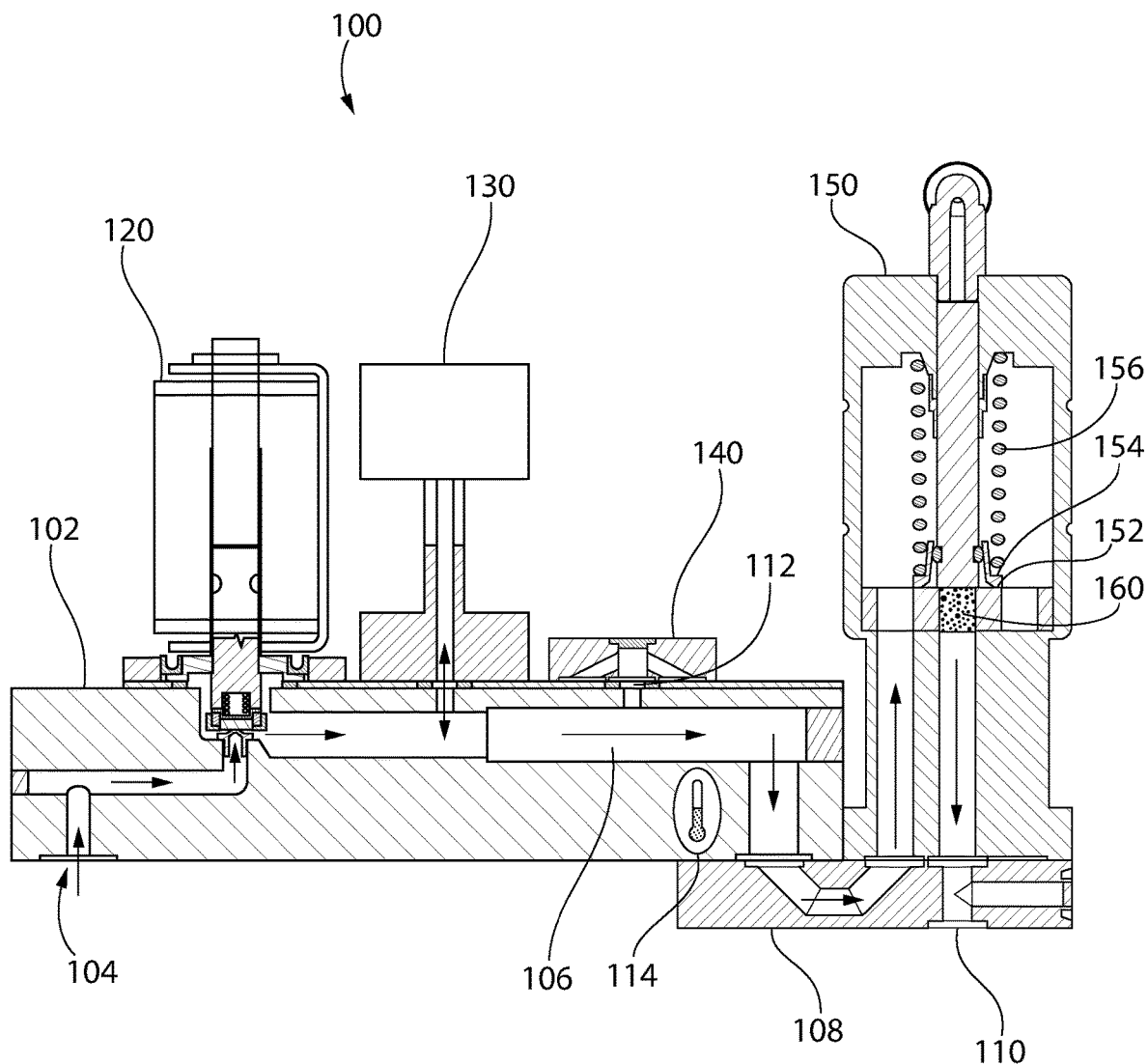
FIG. 1 is a cross sectional view of an apparatus for controlling gas flow.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a method of improving the transient turn on performance of pressure based apparatuses for controlling mass flow. These apparatuses are used to provide steady state control of gas flows in a variety of industrial applications. In some embodiments, these apparatuses may be mass flow controllers which control the mass flow rate of a gas. Semiconductor fabrication is one industry which demands high performance in control of gas flows. As semiconductor fabrication techniques have advanced, customers have recognized the need for rapid and repeatable transient response in starting a gas flow. The need to reduce process times, minimize wasted process gas, improve yield, and increase factory throughput all drive the need for improved transient responses in apparatuses for controlling flow. In particular, the transient turn on time, or "TTO time," is a key parameter of next generation apparatuses for controlling flow. Lower transient turn on times and settling times help to drive down semiconductor fabrication costs.

FIG. 1 shows a cross sectional view of an apparatus for controlling flow 100. The gas flow path of the process gas is indicated by arrows which illustrate the path that the process gas takes through the apparatus 100. The apparatus 100 has a base 102 comprising a gas inlet 104 and a gas outlet 110, the gas flow path extending between the gas inlet 104 and the gas outlet 110. A supply of process gas is delivered to the gas inlet 104 of the base 102. The process gas then flows through a proportional valve 120 into a P1 volume 106 within the base 102. The proportional valve 120 meters the amount of process gas which passes to the P1 volume 106. The proportional valve 120 is capable of providing proportional control of the process gas such that it need not be fully open or closed, but instead may have intermediate states to permit control of the mass flow rate of process gas. In some embodiments, the proportional valve 120 may have a closure member which can move to a plurality of distinct positions between the fully open and fully closed positions. In some cases, the closure member may be infinitely adjustable. In yet other embodiments, the proportional valve 120 may open and close rapidly to control the amount of gas which flows through the proportional valve 120. The proportional valve 120 may utilize any method of metering the mass flow rate of process gas into the P1 volume 106.

A pressure transducer 130 is attached to the base 102 and is fluidly coupled to the P1 volume 106 so that it can sample the pressure within the P1 volume 106. The base 102 may incorporate one or more additional ports 112 to permit alternate configurations. In the present embodiment, the port 112 is blocked with a cap component 140. Alternate configurations may incorporate additional components or position the components differently to achieve different mass flow rates, or additional functions to further improve transient performance.

Next, the process gas flows out of the P1 volume 106 into an on/off valve 150. Internal to the on/off valve 150 is a valve seat 152 and a closure member 154. When the apparatus 100 is delivering process gas, the on/off valve 150 is in an open state, such that the valve seat 152 and the closure member 154 are not in contact. This permits free flow of the process gas, and provides a negligible restriction to fluid flow. When the apparatus 100 is commanded to stop the flow of the process gas, the closure member 154 and the valve seat 152 are biased into contact by the spring 156, stopping the flow of process gas through the on/off valve 150.

Downstream of the valve seat 152 is a characterized flow restrictor 160 which provides a known restriction to fluid flow. This restriction may be described as a flow impedance, a higher flow impedance providing an increased restriction to fluid flow. The characterized flow restrictor 160 may be selected or adjusted to have a range of flow impedances. This allows the same apparatus 100 to be optimized for different ranges of mass flow rates that the apparatus 100 may supply. The characterized flow restrictor 160 may be formed as a porous block, a device having small orifices or channels, or any other means of providing a restriction to process gas flow that is characterized across a target dynamic operating range of mass flow rates. The characterized flow restrictor 160 has a greater flow impedance than the passages upstream and downstream of the characterized flow restrictor 160. After passing through the characterized flow restrictor 160, the process gas exits the gas outlet 110. Generally, the gas outlet 110 of the apparatus 100 is coupled to a manifold, the manifold directing a plurality of process gases to an applicator in the process equipment.

Optionally, temperature sensors may be employed to further enhance the accuracy of the apparatus 100. A temperature sensor 114 is shown in FIG. 1, located within the base 102 so that it can measure the temperature near the P1 volume 106. Additional temperature sensors 114 may be employed in a variety of locations, including the proportional valve 120, the pressure transducer 130, and the on/off valve 150. Furthermore, a pressure sensor downstream of the characterized flow restrictor 160 may be utilized to further increase the accuracy of the mass flow delivered by the apparatus 100.

Figure 2:
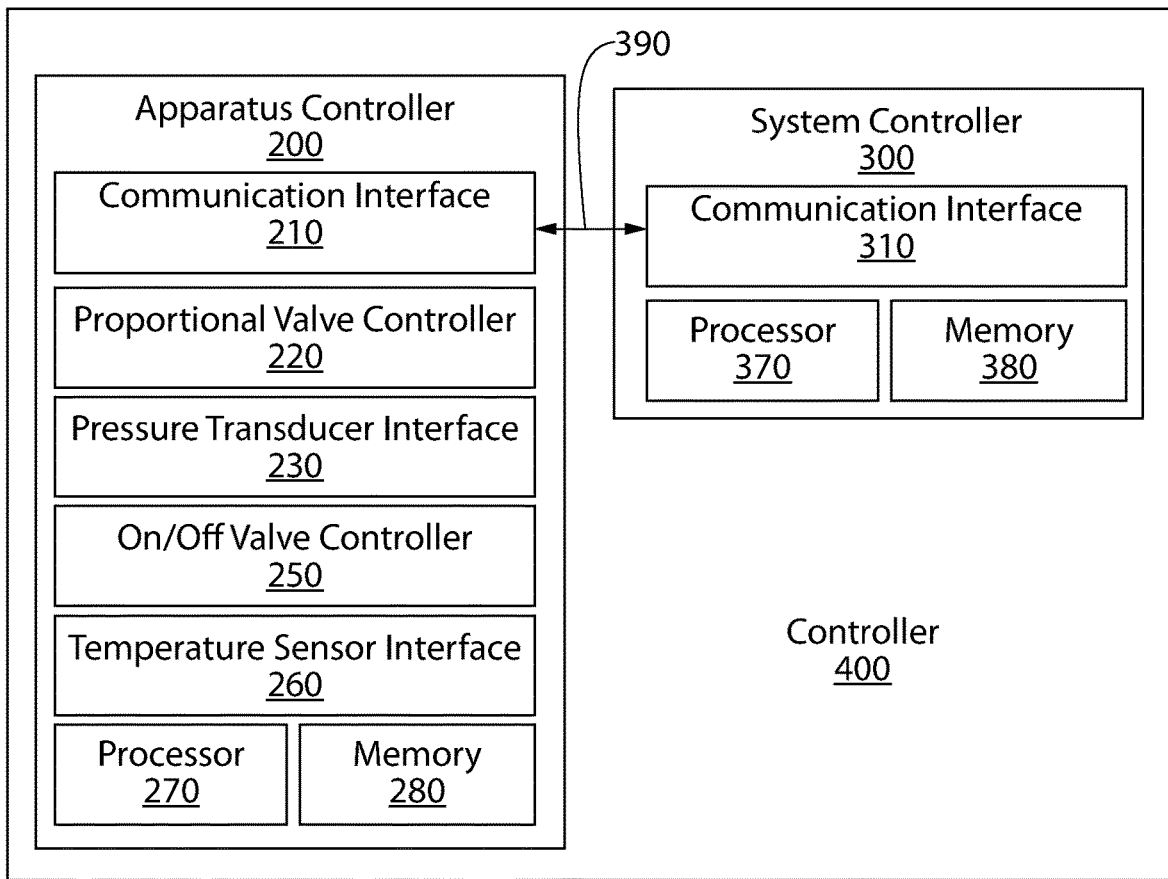
FIG. 2 is a block diagram illustrating the control system for the apparatus of FIG. 1.

Turning to FIG. 2, a block diagram illustrates the control system for the apparatus 100 of FIG. 1. This block diagram shows a controller 400 comprising an apparatus controller 200 and a system controller 300. In this embodiment, the controller 400 is divided into two parts. The apparatus controller 200 provides all control functions for the apparatus 100. The apparatus controller 200 has a communication interface 210, a proportional valve controller 220, a pressure transducer interface 230, an on/off valve controller 250, a temperature sensor interface 260, a processor 270, and memory 280. The communication interface 210 is configured to provide a communications link between the apparatus controller 200 and the system controller 300. Optionally, the temperature sensor interface 260 may be omitted if the additional accuracy provided by the temperature sensor 114 is not required.

The system controller 300 has a corresponding communication interface 310, a processor 370, and memory 380. The system controller 300 coordinates all high level functions necessary to perform the desired process. The communication interface 310 of the system controller 300 sends and receives commands through a communications bus 390. The communications bus 390 connects to the communication interface 210 of the control module 210 of the apparatus 100. The communications bus 390 may connect to a single apparatus controller 200, or it may connect to a plurality of apparatus controllers 200, each apparatus controller 200 operating a distinct apparatus 100. Not all apparatus controllers 200 need control an apparatus 100 for controlling mass flow. Instead, other types of process equipment may also be controlled. Furthermore, there may be a plurality of communications buses 390 to connect all the devices required to perform the desired process.

Internal to the system controller 300, the processor 370 and the memory 380 operate to carry out the desired process. The processor 370 provides the timing necessary to ensure that the appropriate steps are carried out for the desired duration, and provides instructions to the apparatus controller 200 of the apparatus 100. The necessary information is transmitted from the system controller 300 to the apparatus controller 200 as a gas flow activation signal. The gas flow activation signal may consist of information such as the desired state of the apparatus 100 (i.e. flowing gas or not flowing gas), a predetermined mass flow rate needed to complete the process, a predetermined mass flow rate required at a future time, and the future time at which the predetermined mass flow rate is required. In other embodiments, the gas flow activation signal may provide information that instructs the apparatus controller 200 to begin flowing gas upon receipt of a trigger signal.

A time stamp or other synchronization method may be provided in the instructions to ensure that the system controller 300 and the apparatus controller 200 are synchronized. This ensures that process events occur at the desired time. Other methods may be used to ensure that the apparatus begins flowing gas at the desired time. In addition, other signals may be transmitted between the system controller 300 and the apparatus controller 200. For instance, an acknowledgement message or current status message may be issued from the apparatus controller 200 to the system controller 300 to provide the current state or confirm the receipt of instructions. Status messages may be provided automatically, in response to an input, or in response to a polling message from the system controller 300. Where a trigger signal is used instead of a future turn-on time, the apparatus controller 200 will begin priming the apparatus 100 and will wait for the trigger signal to open the on/off valve 150.

Similarly, the processor 270 and memory 280 of the apparatus controller 200 operate to maintain timing, send and receive messages through the communication interface 210, and operate the functions of the apparatus 100. The processor 270 of the apparatus 100 implements a closed loop feedback system. When the apparatus controller 200 is instructed to deliver process gas, the apparatus controller 200 monitors the pressure in the P1 volume 106 using the measurements taken from the pressure transducer 130. The pressure transducer interface 230 takes readings from the pressure transducer 130. This information, in combination with the known flow impedance provided by the characterized flow restrictor 160, is used to calculate the mass flow rate of the process gas through the apparatus 100. A temperature value determined from the temperature sensor 114 may also be used to further enhance the accuracy of the calculation. The value of the flow impedance is stored in the memory 280 along with other constants and calibration data to enable accurate calculation of the various process parameters.

The processor 270 then compares the current mass flow rate through the apparatus 100 against the predetermined mass flow rate provided by the system controller 300. The proportional valve controller 220 commands the proportional valve 120 to increase or decrease the flow rate of process gas into the P1 volume 106 to achieve a target pressure in the P1 volume 106 that will result in the predetermined mass flow rate. This process is continually repeated until the apparatus controller 200 is commanded to stop delivering process gas. At this time, the proportional valve 120 is closed. The on/off valve controller 250 also commands the on/off valve 150 to close, halting flow of the process gas through the outlet 110. The on/off valve 150 remains closed until the apparatus controller 200 is instructed to deliver process gas. At that time, the on/off valve 150 is opened and the apparatus 100 resumes operation.

In yet other embodiments, the controller 400 may incorporate the functionality of both the apparatus controller 200 and the system controller 300 into a single device which need not be connected by a communications bus 390. Instead, the proportional valve 120, on/off valve 150, and other elements are interfaced directly by a single controller which generates a gas flow activation signal internally to the controller 400. A single controller may interface more than one device. This configuration has the advantage of elimination of redundant hardware, but requires greater controller complexity.

In operation, the apparatus controller 200 is instructed to begin delivering flow at a future time when the gas flow activation signal is provided. This generally occurs when the apparatus 100 is shut off and no gas is being delivered to the gas outlet 110. The gas flow activation signal is generated by the system controller 300 and received by the apparatus controller 200. The gas flow activation signal includes information which instructs the apparatus controller 200 to change from zero flow to a predetermined flow rate having a non-zero positive value. The receipt of the gas flow activation signal by the apparatus controller 200 begins a priming period. Upon receipt of the gas flow activation signal, the apparatus 100 prepares to deliver gas at the predetermined flow rate. In this instance, "upon" means at any time concurrent or subsequent to the event. Thus, the apparatus 100 may prepare to deliver gas at any time concurrent or subsequent to the receipt of the gas flow activation signal by the apparatus controller 200.

When the apparatus 100 is shut off, both the proportional valve 120 and the on/off valve 150 are closed. In order to prime the apparatus prior to beginning the flow of gas, the proportional valve controller 220 of the apparatus controller 200 commands the proportional valve 120 to open to achieve a target pre-flow pressure in the P1 volume 106. The target pre-flow pressure is calculated to achieve the predetermined flow rate based on the flow impedance of the flow restrictor 160, subsequent to the opening of the on/off valve 150. At the occurrence of the turn on time $t_2$ at which the gas flow activation signal commands the gas flow to begin, the on/off valve 150 is moved from an off state where the on/off valve 150 is closed to an on state where the on/off valve 150 is open. This ends the priming period for the apparatus 100. The gas then begins to flow out of the P1 volume 106, past the on/off valve 150 and the flow restrictor 160, and out of the gas outlet 110. The apparatus 100 then drives the delivered flow rate to the predetermined flow rate using its normal control system. This system typically operates on a PID feedback loop to ensure that a delivered flow rate is substantially identical to the predetermined flow rate.

The transient turn on time of the apparatus 100 is measured from the time that the on/off valve 150 is commanded to open until the delivered flow rate delivered by the apparatus 100 has stabilized within a certain range. In many instances, the delivered flow rate must be within plus or minus 2% of the predetermined mass flow rate. However, stability windows of plus or minus 5%, 1%, 0.8%, 0.5%, 0.25%, or 0.1% may also be specified, depending on the process requirements.

Figure 3:
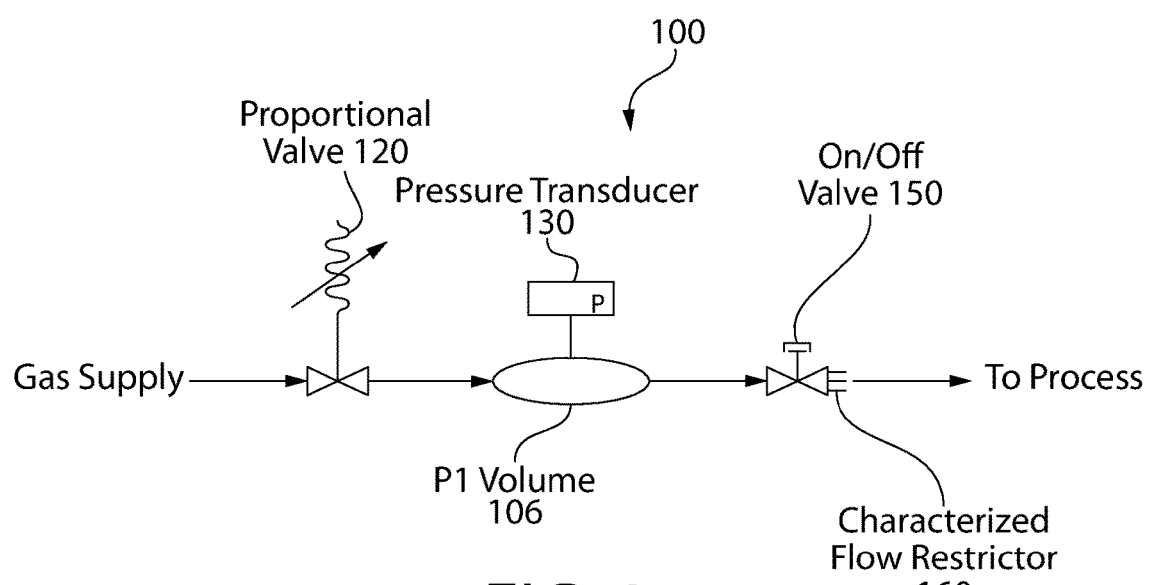
FIG. 3 is a schematic diagram of the apparatus of FIG. 1.

Turning to FIG. 3, a schematic diagram of the apparatus 100 discussed above is provided. When the apparatus 100 is instructed to deliver process gas, the process gas flows through the proportional valve 120. The proportional valve 120 meters the process gas into the P1 volume 106. Process gas then passes through the on/off valve 150 and the characterized flow restrictor 160. Thus, a known mass flow of process gas is delivered to the process. When the apparatus 100 is instructed to cease delivery of process gas, the proportional valve 120 and the on/off valve 150 are closed, stopping flow of process gas.

Typical commercially available apparatuses for flow control provide a transient turn on time in the range of 500 to 1000 milliseconds with an accuracy of plus or minus 2%. The semiconductor industry typically uses a range of plus or minus 2% of the set point as the window for measuring the transient turn on time. The transient turn on time is determined by the earliest time that the delivered mass flow rate enters and remains within the 2% window. Although other percentages may be used, many semiconductor manufacturers adhere to the 2% specification.

The transient turn on time is dictated by inherent limitations in flow sensing and the speed that the proportional valve 120 can respond to commands. Flow sensing limitations are controlled by the frequency at which the pressure transducer 130 reading is taken and the speed at which the pressure transducer 130 can respond to changes in pressure in the P1 volume. The proportional valve 120 also has limitations on how fast it can modulate its opening position or otherwise control the metered flow rate into the P1 volume 106. Furthermore, the size of the P1 volume 106 also affect the transient turn on time, the transient turn off time, and the stability of the resulting mass flow. Faster transient turn on and turn off times may be achieved by minimizing the size of the P1 volume 106, but there are limitations to this approach. For instance, stability may be adversely affected by minimizing the size of the P1 volume 106.

Thus, commercially available apparatuses are unable to significantly reduce their transient turn on times below 500 milliseconds due to the inherent system limitations of pressure based apparatuses. These apparatuses accept instructions from the system controller 300 that essentially consist of a command to change the predetermined mass flow rate from zero to a given value, with no advance notice of the predetermined mass flow rate. Accordingly, the transient turn on time is merely the time to achieve the predetermined mass flow rate in a single instantaneous step. Current commercially available apparatuses receive no advance notice of the turn on command.

The present approach does not rely on the use of extremely fast proportional valves, on/off valves, or pressure transducers to achieve substantial reductions in transient turn on times. For instance, commercially available on/off valves may have response times in the range of 3 to 80 milliseconds. On/off valves having a response time of 50 milliseconds are commonly available at reasonable prices. Faster valves can be used, but generally incur additional cost. For the sake of discussion, a response time of 50 milliseconds is assumed.

In order to achieve improved transient turn on times, the gas flow activation signal issued by the system controller 300 includes information about both the predetermined mass flow rate required by the process and a future turn on time $t_2$ that that apparatus 100 should open the on/off valve 150 to begin supplying process gas. The apparatus controller 200 receives the gas flow activation signal at a first time $t_1$. Providing the gas flow activation signal in advance of the turn on time $t_2$ allows the apparatus 100 to pre-pressurize the P1 volume 106 during the priming period and overcomes limitations related to valve and pressure transducer response times. The turn on time $t_2$ is also known as a second time. In alternate embodiments, the gas flow activation signal includes information instructing the apparatus controller 200 to wait for a trigger signal to open the on/off valve 150 rather than a specific time for beginning gas flow.

Figure 4:
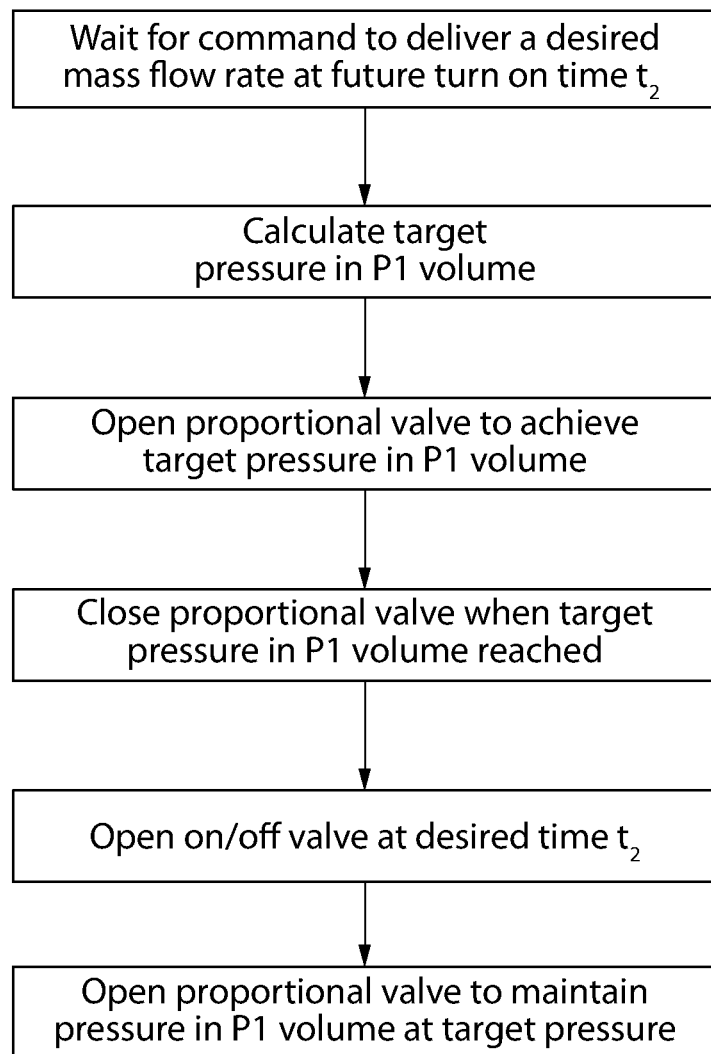
FIG. 4 is a flow chart illustrating a first method of improving transient turn on performance.

In the first method, shown in FIG. 4, the apparatus controller 200 of the apparatus 100 waits for the gas flow activation signal instructing it to deliver a predetermined mass flow rate at future turn on time $t_2$. During the time prior to the receipt of the command, the apparatus 100 is generally off. However, it is possible that the same method may be used to alter the predetermined flow rate from one non-zero mass flow rate to another non-zero mass flow rate. Upon receipt of the gas flow activation signal, the apparatus controller 200 computes a target pre-flow pressure in the P1 volume 106 to achieve the predetermined mass flow rate. The proportional valve 120 is then opened under proportional integral derivative ("PID") control to achieve the target pre-flow pressure in the P1 volume 106. Once the target pre-flow pressure in the P1 volume 106 is reached, the proportional valve 120 is closed to prevent the pressure in the P1 volume 106 from overshooting the target pressure. At the turn on time $t_2$, the on/off valve 150 is opened and the apparatus 100 begins delivering process gas. The proportional valve 120 is then opened to maintain the pressure in the P1 volume 106.

Depending on the duration of the priming period and the speed at which the proportional valve 120 is able to reach the target pre-flow pressure in the P1 volume 106, the proportional valve 120 may not close before the turn on time $t_2$ is reached. In this case, it is likely that the proportional valve 120 will meter less process gas into the P1 volume 106 than needed to achieve the target pre-flow pressure. The apparatus 100 is now in a primed condition which is selected to achieve the predetermined flow rate. In the ideal implementation, adequate priming period is provided so that the proportional valve 120 is able to pre-pressurize the P1 volume 106 prior to the turn on time $t_2$. In some other embodiments, the turn on time $t_2$ may occur prior to achievement of the target pre-flow pressure or immediately upon achievement of the pre-flow pressure. It is not necessary that the proportional valve 120 close prior to the turn on time $t_2$. It is conceived that it remains open, achieving the target pre-flow pressure in the P1 volume 106 exactly at the turn on time $t_2$.

In order to achieve the target pre-flow pressure in the P1 volume 106, the proportional valve 120 may open fully, or may only open partially. The opening position and the pressurization profile of the pressure in the P1 volume 106 may be adjusted in any manner necessary to achieve the target pressure. The pressurization profile may be controlled so that pressure rises linearly. Or in other embodiments, the pressurization profile may be controlled so that the P1 volume 106 reaches the target pre-flow pressure as soon as possible without overshoot.

In some embodiments, the estimated time to achieve the primed condition may be calculated, and the proportional valve 120 may be opened earlier or later to alter the time required to prime the P1 volume 106. In some instances, the slope may vary depending on the predetermined flow rate, the pressure of the supplied process gas at the gas inlet 104, the priming period, or other factors.

The present method offers the advantage of eliminating the need to pressurize the P1 volume 106 subsequent to the turn on time $t_2$. This reduces the transient turn on time, particularly for low flow rates. The apparatus 100 may be arranged such that the on/off valve 150 is upstream or downstream of the calibrated flow restrictor 160. In the event that the calibrated flow restrictor 160 is upstream of the on/off valve 150, a pulse of high pressure process gas is delivered before the flow stabilizes. This undesirably wastes process gas, but the pulse will not meaningfully impact the transient turn on time, as it occurs much more rapidly than the flow rate can stabilize within the target boundaries. In the event that the calibrated flow restrictor 160 is downstream of the on/off valve 150, no pulse occurs, but the process gas must flow through the flow restrictor 160. Furthermore, there is a small additional unpressurized volume downstream of the on/off valve 150 that results in a slight pressure drop. In practice, this additional volume causes a negligible change in pressure in the P1 volume 106 as long as the flow restrictor 160 is located near the valve seat 152. In some embodiments, the flow restrictor 160 is located adjacent the valve seat 152, with 1 cc or less volume between the flow restrictor 160 and the valve seat 152. A volume of 0.5, 0.2, 0.1, or 0.02 cc is preferred.

The present method operates most effectively where the predetermined mass flow rate is low as compared with the mass of process gas in the P1 volume 106. In contrast to other methods of improving response time, this method offers the dual advantages of improving stability and reducing transient turn on times. This is because the P1 volume 106 need not be reduced in size to the utmost degree, lessening the burden on the proportional valve 120 and the apparatus controller 200. However, for larger mass flow rates as compared with the mass in the P1 volume 106, the mass flow rate dips undesirably as the process gas flows out of the P1 volume 106. The P1 volume 106 is generally of insufficient size to act as a cushion when the on/off valve 150 is opened. Then, the proportional valve 120 is commanded to open rapidly. Both the apparatus controller 200 and the proportional valve 120 have speed limitations which undesirably lengthen the time before the target pressure in the P1 volume is restored. Though the present method still offers advantages over commercially available apparatuses, this method does not provide similar stability and transient turn on performance over the entire operating range.

Having a larger P1 volume 106 to mass flow rate results in an improved damping effect, preventing the pressure in the P1 volume 106 from dropping rapidly after the turn on time $t_2$. Increasing mass flow rates increase the burden on the apparatus 100. As noted previously, the proportional valve 120 generally closes prior to the turn on time $t_2$ as a result of the need to avoid overshooting the target pressure in the P1 volume 106. Once the turn on time $t_2$ passes, the proportional valve 120 is instantaneously commanded to open to counteract the rapid change in pressure in the P1 volume 106 resulting from the opening of the on/off valve 150. Thus, the ability of the apparatus 100 to maintain the predetermined mass flow rate becomes increasingly dependent on the response time of the proportional valve 120 and the control loop implemented in the apparatus controller 200 as the predetermined mass flow rate increases.

Figure 5:
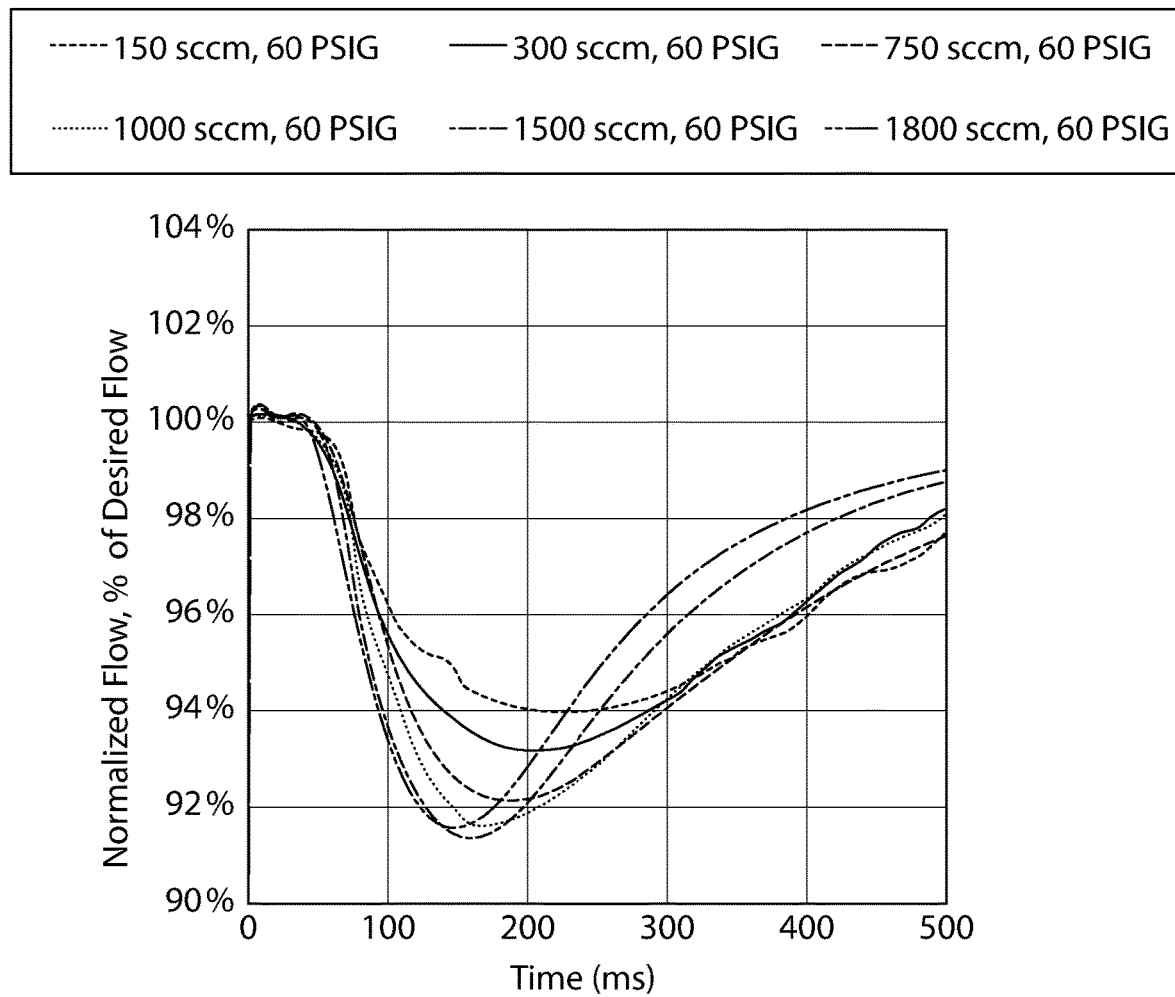
FIG. 5 is a graph illustrating normalized mass flow rates resulting from implementation of the method of FIG. 4.

FIG. 5 shows the test results of the method of FIG. 4 for a range of predetermined mass flow rates. Mass flow rates of 150, 300, 750, 1000, 1500, and 1800 standard cubic centimeters per minute ("sccm") were tested at a process gas supply pressure of 515 kpa (60 psig). The mass flow rates were graphed from the turn on time $t_2$ to 500 milliseconds and normalized so that the predetermined mass flow rate was equal to 100%. As the predetermined mass flow rates increased, the delivered flow rate drops to a lower percentage of the predetermined mass flow rate, with the 1000 sccm, 1500 sccm, and 1800 sccm mass flow rates falling below 92% of the desired rate. Furthermore, the time to reach 2% of the predetermined mass flow rate was approximately 500 milliseconds for the highest flow rates.

Figure 6A:
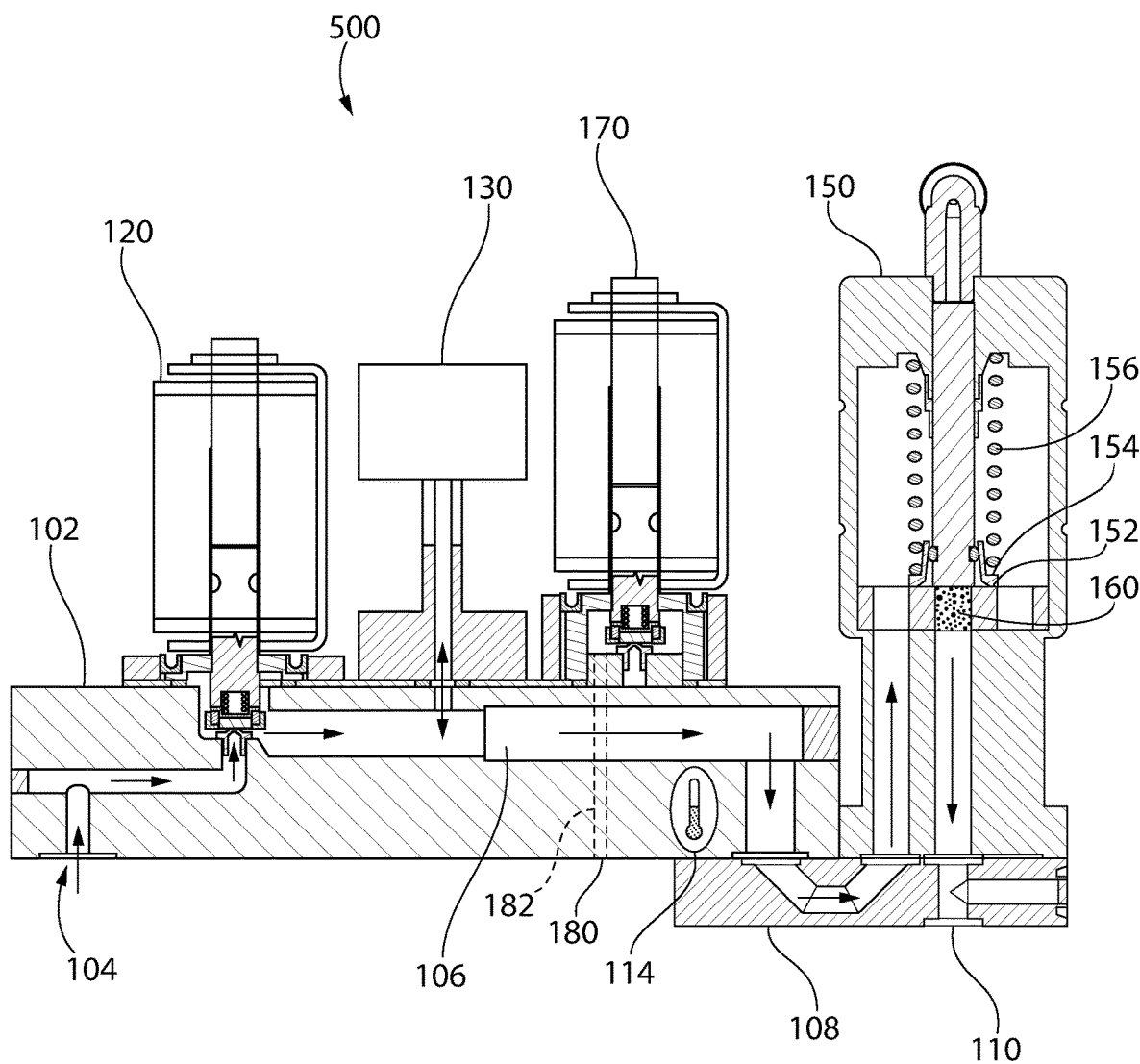
FIG. 6A is a cross sectional view of another embodiment of an apparatus for controlling gas flow.

In yet further embodiments, a bleed valve may be used, such as that shown in the apparatus 500 of FIG. 6A. The bleed valve 170 is capable of bleeding gas from the P1 volume 106 into a non-process location through a bleed passage 182 to a bleed outlet 180, the bleed outlet 180 being isolated from the gas outlet 110. The bleed valve 170 may be a proportional valve similar to the proportional valve 120. This allows the pressure in the P1 volume 106 to be controlled by the bleed valve 170 while simultaneously controlling the flow of gas through the proportional valve 120 into the P1 volume 106. This modification provides greater control over the resulting pre-flow pressure and the flow rate through the proportional valve 120. The bleed valve 170 may be controlled in any manner desired to achieve the desired pre-flow pressure, including simultaneous opening with the proportional valve 120, subsequent opening, or even opening prior to the opening of the proportional valve 120. The bleed valve 170 may be opened with a variety of profiles and ramp rates to control the pressure in the P1 volume 106 including linear, exponential, or other profiles. It is also contemplated that the opening of the proportional valve 120 may be held constant while the bleed valve 170 controls the pressure in the P1 volume 106.

Figure 6B:
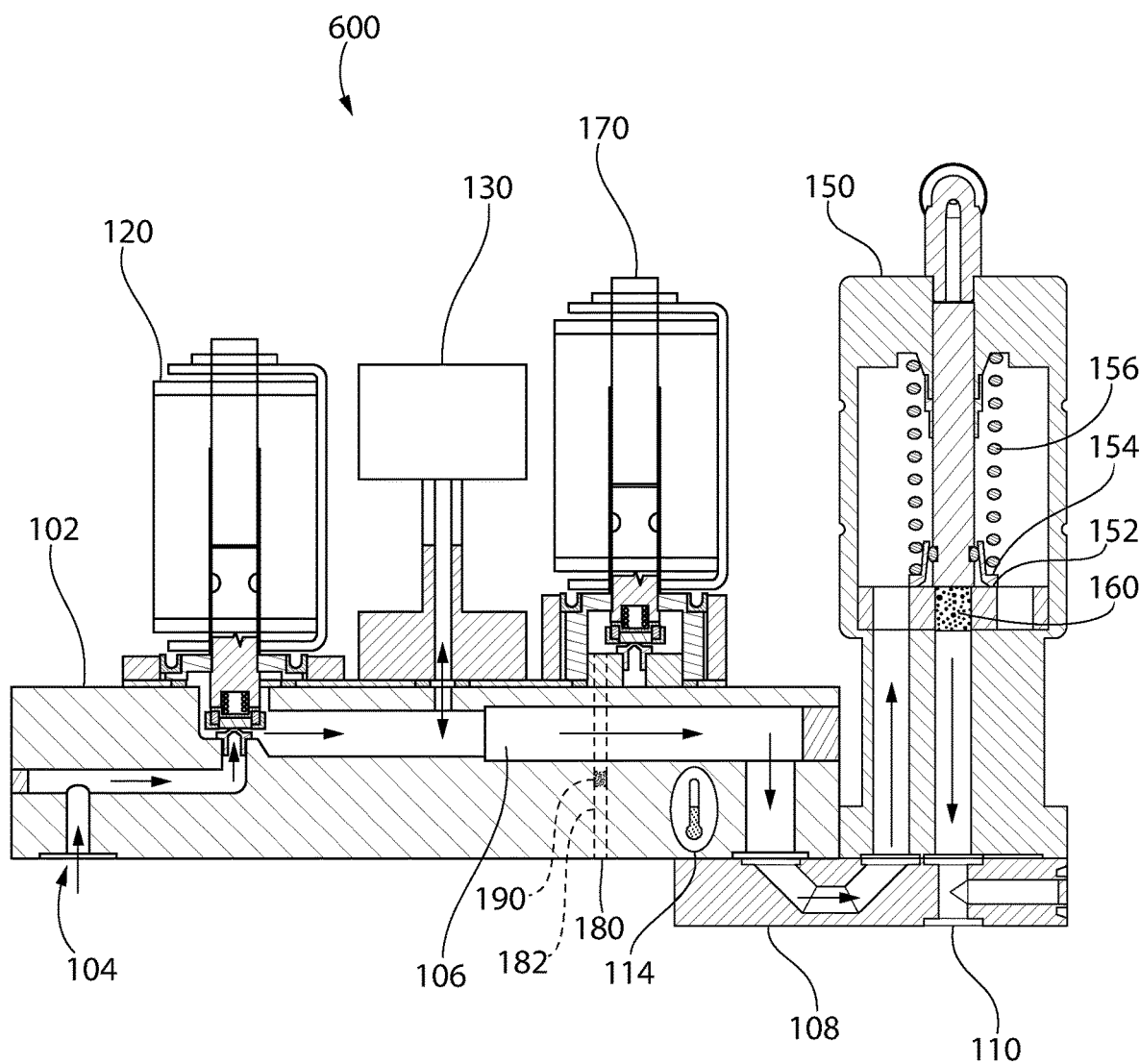
FIG. 6B is a cross sectional view of another embodiment of an apparatus for controlling gas flow.

In other embodiments, such as the one shown in FIG. 6B, the bleed valve 170 may be an on/off valve similar to the on/off valve 150. The bleed valve 170 is used in combination with a second characterized restrictor 190 located within the bleed passage 182. This allows a known flow rate of gas to be metered out of the P1 volume 106 to the bleed outlet 180 and the non-process location. Alternately, the second characterized restrictor 190 may be located between the bleed valve 170 and the P1 volume 106.

Figure 7:
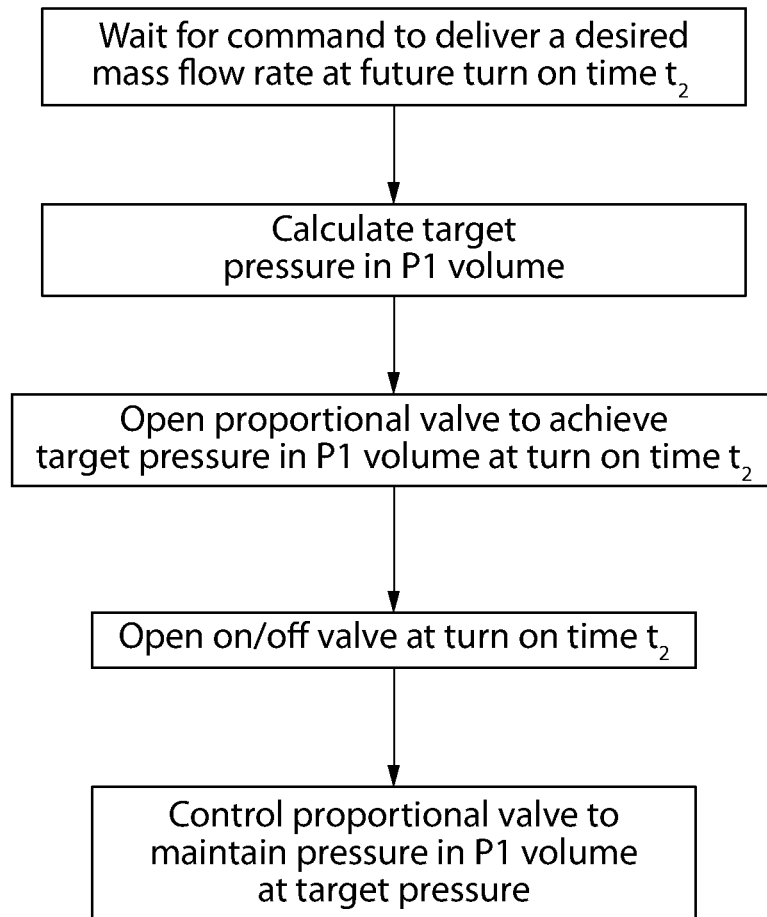
FIG. 7 is a flow chart illustrating a second method of improving transient turn on performance.

FIG. 7 illustrates a second method of improving transient turn on time for the apparatus 100. Initially the apparatus 100 is off, such that it delivers no process gas. The apparatus controller 200 of the apparatus 100 waits for the gas flow activation signal instructing it to deliver a predetermined mass flow rate of gas at the future turn on time $t_2$. Once the signal is received, the priming period begins. The apparatus controller 200 calculates the target pre-flow pressure in the P1 volume 106 required to achieve the predetermined mass flow rate. The proportional valve 120 is then opened under PID control, with the goal of achieving the target pre-flow pressure in the P1 volume 106 at the turn on time $t_2$. Thus, two boundary conditions are specified. Not only is the pressure driven to the target pre-flow pressure by the proportional valve 120, but the target pre-flow pressure is reached at the time that the on/off valve 150 is scheduled to open. Then the on/off valve 150 is opened at the turn on time $t_2$. Finally, the proportional valve 120 is controlled so that the pressure in the P1 volume 106 is maintained at the target pressure. This causes the delivered flow rate of the apparatus 100 to quickly settle at the predetermined mass flow rate. As mentioned above, an apparatus incorporating the bleed valve FIG. 8 discloses a third method of improving transient turn on time for the apparatus 100. In this method, the proportional valve 120 is driven such that the target pre-flow pressure is achieved in the P1 volume 106 at the turn on time $t_2$ as with the second method disclosed above. Simultaneously, the mass flow rate across the proportional valve 120 is also driven to the predetermined mass flow rate at the turn on time $t_2$. This offers a further improvement because three boundary conditions are met simultaneously. By controlling the mass flow rate across the proportional valve 120 at the turn on time $t_2$, the delivered mass flow rate through the apparatus 100 will settle to very near the predetermined mass flow rate. Furthermore, the proportional valve 120 will not need to move significantly to maintain the pressure in the P1 volume at the target pressure.

Thus, this method has the goal of priming the P1 volume 106 to the target pre-flow pressure, but it also has the goal of having the proportional valve 120 open and flowing approximately the predetermined mass flow rate into the P1 volume 106 at the turn on time $t_2$. This has the benefit of minimizing the necessary movement of the proportional valve 120 upon the opening of the on/off valve 150. Therefore, the corrective action commanded by the proportional valve 120 PID loop is reduced such that the delivered flow through the characterized flow restrictor 160 does not drop out of the target range. Furthermore, the performance of the apparatus 100 is nearly identical for a wide range of predetermined mass flow rates. The present method is able to settle far faster than the method of FIG. 4 at all mass flow rates.

The mass flow into the P1 volume 106 can be calculated during the priming period. During this period, the on/off valve 150 is closed. The volume of the P1 volume 106 is measured and stored in the memory 280 of the apparatus controller 200. The mass flow into the P1 volume 106 is calculated using the measured pressure from the pressure transducer 130 and the current temperature combined with the time based derivative of the Ideal Gas law. Thus, the calculation of mass flow into the P1 volume 106 is:

$$\text{Massflow(sccm)} = dP(\text{atm})/dt(\text{min}) * V(cc) * \text{Temp}_{reference}(\text{deg K})/\text{Temp}_{current}(\text{deg K})$$

Thus, the mass flow in sccm is equal to the change in pressure in atm per time in minutes multiplied by the volume of the P1 volume 106 times the reference temperature in degrees Kelvin divided by the current temperature in degrees Kelvin. In the semiconductor industry, the reference temperature is defined to be 273.15° Kelvin (0° C.). The change in pressure is the pressure drop from the gas source to the P1 volume 106, as regulated by the proportional valve 120. The apparatus controller 200 can then adjust the rate of increase of pressure in the P1 volume 106 to achieve the three boundary conditions of target pressure and mass flow rate into the P1 volume 106 at the turn on time $t_2$. By controlling the mass flow rate into the P1 volume 106, the position of the proportional valve 120 is controlled. This is because the mass flow rate across the proportional valve 120 is determined by the position of the closure member of the proportional valve 120. In yet other embodiments, the apparatus controller 200 only drives the mass flow rate into the P1 volume 106 at the turn on time $t_2$ without achieving the pre-flow pressure at the turn on time $t_2$. This can allow even faster transient turn on time performance at the expense of some overshoot during initial opening of the on/off valve 150.

The exact method of reaching the boundary conditions may vary. For instance, the pressurization profile may have a linear ramp of pressure in the P1 volume 106 during the priming period. Alternately, a non-linear profile, a plurality of linear ramps, or other profiles may be used. In yet other embodiments, the target pressure may be sculpted to achieve the predetermined mass flow rate into the P1 volume 106 through the use of a variety of profiles. This may include combinations of several different curves to achieve the desired pressurization profile. Depending on the commanded mass flow rate and the amount of time available, a wide range of profiles may be employed. In some embodiments, the pressurization profile or the time to complete the pressurization profile may be constant regardless of the predetermined flow rate. In yet other embodiments, the pressurization profile or the time to complete the pressurization profile may vary based on the predetermined flow rate or the time available before the turn on time $t_2$.

In one very simple pressurization profile, it is conceived that the proportional valve 120 is opened to flow a constant mass flow rate equal to the predetermined mass flow rate through the apparatus 100. Thus, the P1 volume 106 is simply filled at a constant mass flow rate and the pressure in the P1 volume 106 is represented by the area under the mass flow rate profile. The proportional valve 120 must then be opened at a calculated time in advance of the turn on time $t_2$ in order to reach the desired pressure in the P1 volume. For greater predetermined mass flow rates, this advance time must decrease. Thus, this algorithm requires significant advance notice of the turn on time $t_2$ in order to operate effectively for all predetermined mass flow rates. Furthermore, decreasing the mass flow rates used to fill the P1 volume 106 during the priming period further increases the amount of time required prior to the turn on time $t_2$.

In alternate profiles, it is conceived that the proportional valve 120 may be opened such that the mass flow rate into the P1 volume 106 progressively increases in advance of the turn on time $t_2$. For small predetermined mass flow rates, the proportional valve 120 may be commanded to open such that the mass flow rate across the proportional valve 120 increases as the turn on time $t_2$ approaches. The slope of the pressurization profile may increase for greater predetermined mass flow rates because the P1 volume 106 pressurizes more quickly at greater predetermined mass flow rates. It is not necessary that the mass flow rate across the proportional valve 120 be limited to constant or increasing slope. Instead, it is conceived that for some predetermined mass flow rates, the proportional valve 120 is commanded to deliver a mass flow rate greater than that required to achieve the predetermined mass flow rate. This will pressurize the P1 volume 106 even more quickly than a constant slope pressurization profile. Then, the mass flow rate across the proportional valve 120 can be gradually reduced. The mass flow rate across the proportional valve 120 can end at the predetermined mass flow rate when the turn on time $t_2$ elapses.

As can be seen, the flow rate across the proportional valve 120 may be linear, exponential, or any other profile required to achieve the desired boundary conditions. Furthermore, the pressure in the P1 volume 106 is always equal to the area under the mass flow rate profile used to pressurize the P1 volume 106. Thus, although the target pre-flow pressure in the P1 volume 106 may be achieved by opening the proportional valve 120 to enable a slow bleed, this would not position the proportional valve 120 such that it delivers the predetermined mass flow rate after the opening of the on/off valve 150. Accordingly, a significant correction of the proportional valve 120 position would be required, lengthening transient turn on time and adversely affecting stability of the delivered mass flow rate through the apparatus.

A plurality of profiles may be employed to optimize the transient turn on time. In yet other embodiments, a plurality of different pressurization profiles may be employed for a range of different predetermined mass flow rates. This can minimize the required priming period before the transient turn on time $t_2$. Thus, the behavior of the apparatus 100 may be optimized for a wide range of process requirements. The accuracy of the delivered flow, the transient turn on time, and the minimum priming period may all be tuned using customized pressurization profiles.

Figure 8:
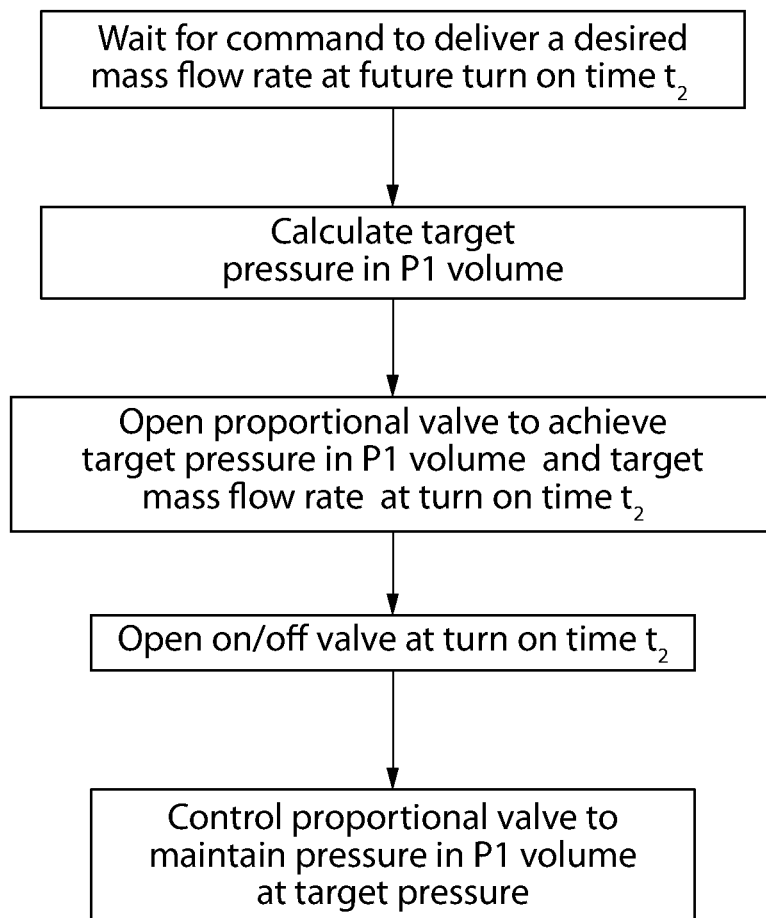
FIG. 8 is a flow chart illustrating a third method of improving transient turn on performance.
Figure 9:
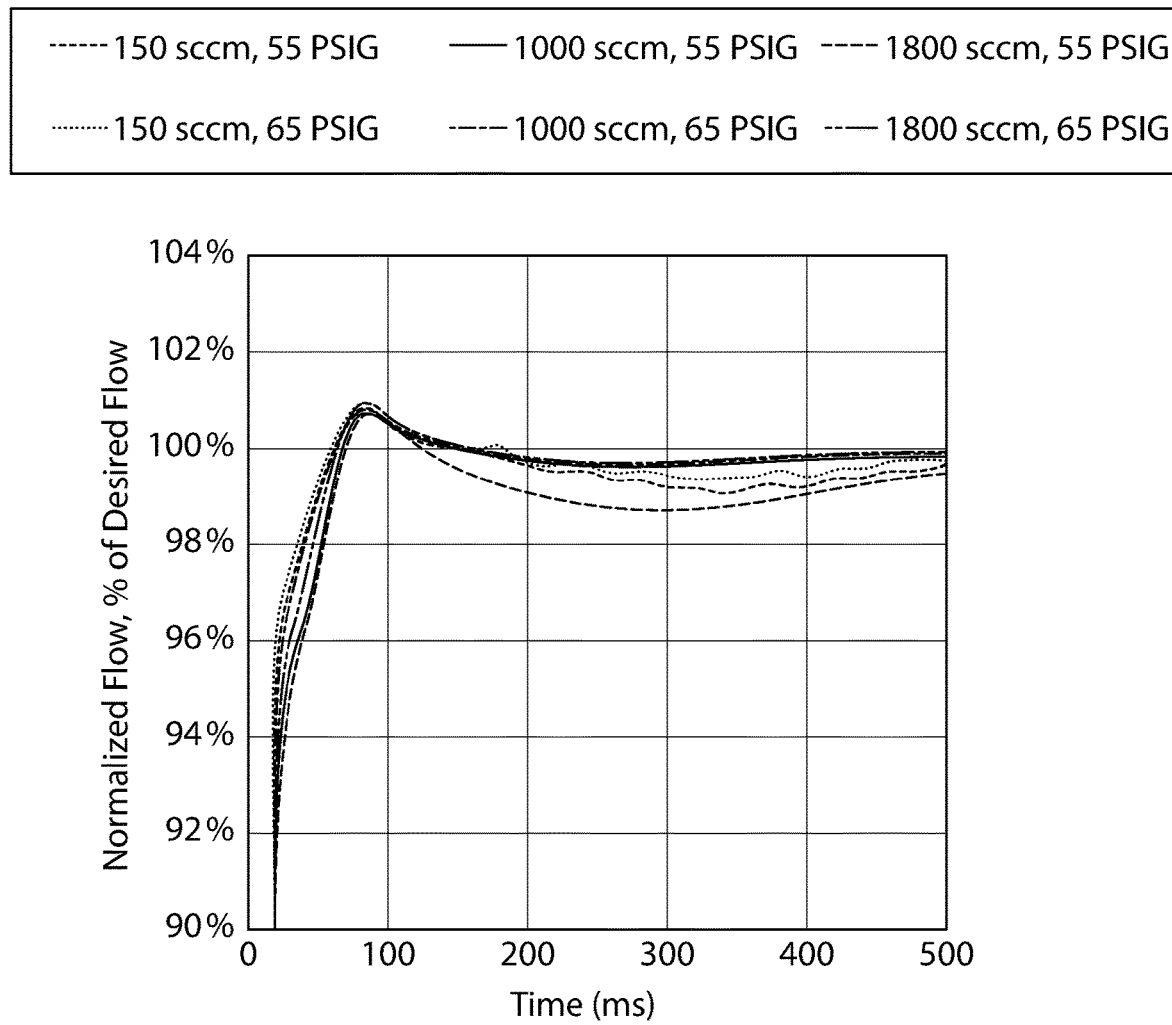
FIG. 9 is a graph illustrating normalized mass flow rates resulting from implementation of the method of FIG. 8.

Test results for the apparatus 100 implementing one embodiment of the method of FIG. 8 are shown in FIG. 9. This method employs a linear ramp of the mass flow rate across the proportional valve 120 to reach the predetermined mass flow rate through the proportional valve 120 at the turn on time $t_2$. This method delivers greatly improved transient turn on performance as compared with commercially available apparatuses. Predetermined mass flow rates of 150 sccm, 1000 sccm, and 1800 sccm were tested on an apparatus 100 rated at 1500 sccm. Process gas supply pressures of 480 kpa (55 psig) and 549 kpa (65 psig) were tested for all predetermined mass flow rates. As can be seen, the delivered mass flow rate rises rapidly to the predetermined mass flow rate for all tested flow rates and supply pressures. It overshoots the predetermined flow rate, then falls slightly before settling out. The worst droop occurs with the 1800 sccm, 55 psi test. However, this drops only approximately 1% of the predetermined flow rate, and all of the transient turn on times are significantly less than 100 milliseconds for a stability window of plus or minus 2%. Settling times are also greatly improved, regardless of process gas supply pressure. The method of FIG. 8 delivers transient turn on time which far exceeds that of commercially available apparatuses.

Figure 10:
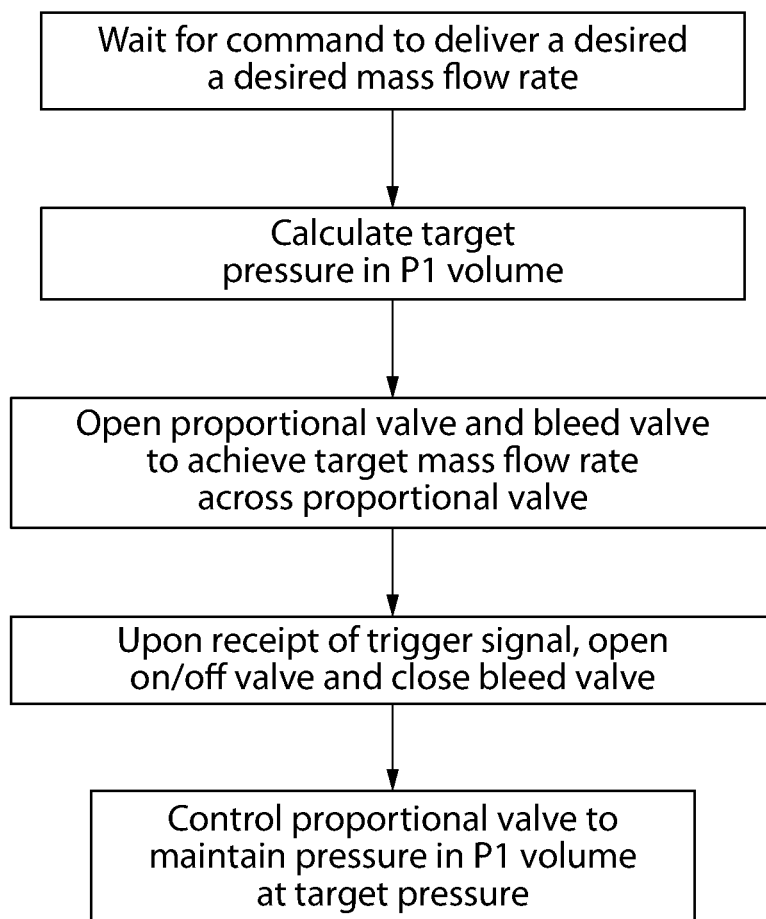
FIG. 10 is a flow chart illustrating a fourth method of improving transient turn on performance.

FIG. 10 discloses a fourth method of improving transient turn on time. This method utilizes one of the apparatuses 500, 600 shown in FIGS. 6A and 6B. In these methods, the proportional valve 120 is driven such that the target pre-flow pressure is achieved in the P1 volume 106 in response to the gas flow activation signal. Simultaneously, the mass flow rate across the proportional valve 120 is also driven to the predetermined mass flow rate and the bleed valve 170 is opened. Optionally, the pressurization profile may be adjusted to account for the bleed of gas from the volume. The bleed valve 170 is driven to maintain the target pre-flow pressure in the P1 volume 106. Upon receipt of a trigger signal, the on/off valve 150 is opened and the bleed valve 170 is closed. This allows the apparatus to quickly deliver gas at the predetermined flow rate without requiring exact timing for the turn on time $t_2$.

Thus, it is possible to bleed excess gas to maintain the target pre-flow pressure in the P1 volume 106 while simultaneously maintaining the proportional valve 120 at the predetermined flow rate. In the embodiments where a fixed characterized restrictor and on/off valve are used, such as the embodiment shown in FIG. 6B, it is possible to maintain the target pre-flow pressure in the P1 volume 106 by varying the mass flow rate across the proportional valve 120. Although this does not guarantee that the proportional valve 120 delivers the desired flow rate at the turn on time $t_2$ when the turn on time is not known, it ensures that the closure member of the proportional valve 120 is close to the desired position. The same technique can be applied to a gas flow activation signal including the turn on time $t_2$ with similar benefits in reduced transient turn on times. Improved performance can be obtained when the turn on time $t_2$ is known, but this is not strictly necessary. Greatly reduced transient turn on times can still be achieved without known turn on times $t_2$ as compared with current commercially available devices.

This offers a further improvement because three boundary conditions are met simultaneously. By controlling the mass flow rate across the proportional valve 120 at the turn on time $t_2$, the delivered mass flow rate through the apparatus 100 will settle to very near the predetermined mass flow rate. Furthermore, the proportional valve 120 will not need to move significantly to maintain the pressure in the P1 volume at the target pressure.

In further enhancements, the performance of the apparatus may be characterized such that offsets such as the response time of the on/off valve 150 may be quantified. The on/off valve 150 may be opened some additional time in advance of the turn on time $t_2$ to further improve system response. For instance, if the response time of the on/off valve 150 is 50 milliseconds, the on/off valve 150 may be opened at the opening time $t_2$ minus 50 milliseconds to ensure that flow begins at exactly turn on time $t_2$. The proportional valve 120 mass flow rate would then be adjusted accordingly, such that the mass flow rate into the P1 volume 106 equals the predetermined mass flow rate at the time the on/off valve 150 is opened. Other response times such as the dead time for the PID control loop may also be characterized to optimize system response. The necessary offsets may be incorporated for the control loop or other delays in the apparatus controller 200. In some cases, it is conceived that the system response may vary depending on the mass flow rate, so a map of advance opening times may be stored in the memory 280 of the apparatus controller 200. The advance opening times may be applied depending on the predetermined flow rate to achieve optimum system response.

In yet other embodiments, the mass flow rate across the proportional valve 120 may be adjusted to further optimize the resulting mass flow rate and transient turn on time. It is conceivable that the mass flow rate across the proportional valve 120 may reach the predetermined mass flow rate at some time in between the opening of the on/off valve 150 and the turn on time $t_2$. Thus, the mass flow rate across the proportional valve 120 may remain constant until the turn on time $t_2$. This ensures that the closure member of the proportional valve 120 is already in position at the turn on time $t_2$. Thus, momentum of the closure member of the proportional valve 120 is minimized. The proportional valve 120 can respond to needed changes to maintain the delivered flow rate at the predetermined flow rate as fast as possible, regardless of whether the flow should be increased or decreased to maintain the delivered flow rate at the predetermined flow rate.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A method of delivering a gas at a predetermined flow rate, the method comprising:
   a) providing a gas flow control apparatus comprising: a gas flow path extending from a gas inlet to a gas outlet; a proportional valve operably coupled to the gas flow path; an on/off valve operably coupled to the gas flow path downstream of the proportional valve, a volume of the gas flow path being defined between the proportional valve and the on/off valve; and a flow restrictor having a flow impedance located downstream of the proportional valve;
   b) pressurizing the volume with the gas to a target pre-flow pressure by opening the proportional valve while the on/off valve is in an off-state, the target pre-flow pressure selected, in view of the flow impedance of the flow restrictor, to achieve the predetermined flow rate; and
   c) opening the on/off valve by moving the on/off valve to an on-state, thereby delivering the gas to the gas outlet at the predetermined flow rate;
   wherein a delivered flow rate of gas from the gas outlet stabilizes within 2% of the predetermined flow rate within 100 milliseconds after step c).

2. The method according to claim 1, further comprising a controller, the controller generating a gas flow activation signal at a first time prior to step b), the gas flow activation signal comprising data instructing the controller to open the on/off valve upon receipt of a trigger signal, step c) occurring at a turn on time in response to the trigger signal.

3. The method according to claim 1, wherein after step b) and prior to step c), the volume is pressurized to the target pre-flow pressure and the proportional valve is closed.

4. The method according to claim 1, wherein step c) occurs as soon as the volume reaches the target pre-flow pressure.

5. The method according to claim 4, wherein the proportional valve has a flow rate substantially equal to the predetermined flow rate when step c) occurs.

6. The method according to claim 1, wherein the gas flow control apparatus further comprises a bleed valve and a bleed outlet, the bleed valve configured to vent gas from the volume to the bleed outlet when the bleed valve is in an on state and wherein the bleed valve is transitioned to an on state during step b).

7. The method according to claim 6, wherein the proportional valve has a flow rate substantially equal to the predetermined flow rate when step c) occurs.

8. The method according to claim 1, wherein step b) further comprises pressurizing the volume with the gas such that a pressure within the volume rises linearly.

9. The method according to claim 1, wherein in step b), a pressure within the volume increases according to a pressurization profile, the pressurization profile being different for a plurality of different predetermined flow rates.

10. A method of delivering a gas at a predetermined flow rate, the method comprising:
    a) providing a gas flow control apparatus comprising: a gas flow path extending from a gas inlet to a gas outlet; a proportional valve operably coupled to the gas flow path; an on/off valve operably coupled to the gas flow path downstream of the proportional valve, a volume of the gas flow path being defined between the proportional valve and the on/off valve; and a flow restrictor having a flow impedance located downstream of the proportional valve;
    b) pressurizing the volume with the gas to a target pre-flow pressure by opening the proportional valve while the on/off valve is in an off-state, the target pre-flow pressure selected, in view of the flow impedance of the flow restrictor, to achieve the predetermined flow rate; and
    c) opening the on/off valve by moving the on/off valve to an on-state, thereby delivering the gas to the gas outlet at the predetermined flow rate;
    wherein the gas flow control apparatus further comprises a controller, the controller generating a gas flow activation signal at a first time prior to step b), the gas flow activation signal comprising data identifying a turn on time, step c) occurring at the turn on time.

11. The method according to claim 10, wherein the controller comprises an apparatus controller and a system controller, the system controller transmitting the gas flow activation signal to the apparatus controller.

12. The method according to claim 10, wherein the gas flow activation signal further comprises data identifying the predetermined flow rate.

13. A method of delivering a gas at a predetermined flow rate, the method comprising:
    a) generating, with a controller, a gas flow activation signal at a first time that comprises data identifying a second time at which the gas is to be delivered from a gas outlet of a gas flow path at the predetermined flow rate, the first time being prior to the second time and a priming period being defined between the first and second times;
    b) upon receipt of the gas flow activation signal, the controller adjusting one or more components of a gas flow control apparatus to achieve a primed condition of the gas in a volume of the gas flow path during the priming period, the primed condition selected to achieve the predetermined flow rate, the gas being prohibited from exiting the gas outlet of the gas flow path during the priming period; and
    c) delivering the gas from the volume at the second time via the gas outlet of the gas flow path.

14. The method according to claim 13, wherein a delivered flow rate of gas from the gas outlet stabilizes within 2% of the predetermined flow rate within 100 milliseconds after step c).

15. The method according to claim 13, wherein the controller comprises an apparatus controller and a system controller, the system controller transmitting the gas flow activation signal to the apparatus controller.

* * * * *